United States Patent
Kuo

(10) Patent No.: US 9,255,975 B2
(45) Date of Patent: Feb. 9, 2016

(54) MAGNETIC-FIELD SENSING METHOD

(71) Applicant: Voltafield Technology Corporation, Jhubei, Hsinchu County (TW)

(72) Inventor: Ming-Yu Kuo, Hsinchu County (TW)

(73) Assignee: VOLTAFIELD TECHNOLOGY CORPORATION, Jhubei, Hsinchu County (TW)

( * ) Notice: Subject to any disclaimer, the term of this patent is extended or adjusted under 35 U.S.C. 154(b) by 67 days.

(21) Appl. No.: 14/320,630

(22) Filed: Jun. 30, 2014

(65) Prior Publication Data
US 2015/0128431 A1 May 14, 2015

(30) Foreign Application Priority Data

Nov. 14, 2013 (TW) .............................. 102141510 A

(51) Int. Cl.
G01C 17/28 (2006.01)
G01R 33/02 (2006.01)
G01R 33/09 (2006.01)

(52) U.S. Cl.
CPC ............ *G01R 33/0206* (2013.01); *G01C 17/28* (2013.01); *G01R 33/09* (2013.01); *G01R 33/093* (2013.01)

(58) Field of Classification Search
CPC .... G01C 17/28; G01R 33/0206; G01R 33/09; G01R 33/093
USPC ................................. 33/316, 319, 355 R, 356
See application file for complete search history.

(56) References Cited

U.S. PATENT DOCUMENTS

| 8,749,232 | B2 * | 6/2014 | Fu ........................ | G01R 33/096 324/252 |
| 2010/0121599 | A1 * | 5/2010 | Boeve .................... | G01C 17/38 702/93 |
| 2011/0074406 | A1 * | 3/2011 | Mather .................. | B85Y 25/00 324/252 |
| 2012/0153937 | A1 * | 6/2012 | Pozzati .................. | B82Y 25/00 324/202 |
| 2014/0067305 | A1 * | 3/2014 | Oliver .................... | G01B 21/16 702/92 |
| 2014/0197827 | A1 * | 7/2014 | Zimmer ................. | G01R 33/09 324/252 |
| 2014/0292312 | A1 * | 10/2014 | Chen .................... | G01R 33/098 324/207.21 |
| 2015/0008913 | A1 * | 1/2015 | Fu ........................ | G01R 33/096 324/252 |

* cited by examiner

*Primary Examiner* — G. Bradley Bennett
(74) *Attorney, Agent, or Firm* — Cheng-Ju Chiang

(57) ABSTRACT

A magnetoresistive sensing device is provided. A first sensed magnetic-field component in parallel with the x-axis and a second sensed magnetic-field component in parallel with the y-axis of an external magnetic field forming a first inclination angle with the x-axis and a second inclination angle with the y-axis are determined. A virtual plane is defined so as to render a magnetic-field component perpendicular to the virtual plane of the external magnetic field is essentially zero. The first inclination angle and the second inclination angle are adjusted with reference to the virtual plane. An x-axis magnetic-field component in parallel with the x-axis, a y-axis magnetic-field component in parallel with the y-axis and a z-axis magnetic-field component in parallel with the z-axis of the external magnetic field are estimated according to the adjusted first inclination angle, the adjusted second inclination angle, the first sensed magnetic-field component and the second sensed magnetic-field component.

10 Claims, 5 Drawing Sheets

MAGNETIC-FIELD SENSING METHOD

FIELD OF THE INVENTION

The present invention relates to a magnetic-field sensing method, and more particularly to a method for sensing a three-dimensional magnetic field by using a two-dimensional magnetoresistive sensing device.

BACKGROUND OF THE INVENTION

With the development of consumer electronic products such as mobile phones and electronic compasses and the use of conventional products such as motors and actuators, the need of magnetoresistive sensors has grown. More particularly, three-dimensional magnetoresistive sensors are capable of sensing the variations of the magnetic field components along the x-axis, the y-axis and the z-axis that are perpendicular to one another. An electronic compass uses a three-dimensional magnetoresistive sensor to precisely sense the terrestrial magnetic field.

Current three-dimensional magnetoresistive sensing devices have been well-developed. However, most of the conventional arts use multi-chip or three-dimensional structured magnetoresistive sensing devices to sense the variations of the magnetic field components along the x-axis and y-axis in parallel with the substrate plane and the variation of the magnetic field component along the z-axis perpendicular to the substrate plane.

Multi-chip or three-dimensional structured magnetoresistive sensing devices have more complicated configurations, higher manufacturing cost and down-scaled semiconductor elements, which result in difficulties in packing the multi-chip or three-dimensional structured magnetoresistive sensing devices hence low process yield. Furthermore, since the variations of the magnetic field components along the x-axis, the y-axis and the z-axis are sensed by using a plurality of magnetoresistive sensing units with different sensitivities, the values of the sensed results have to be normalized, which results in more significant inaccuracy and poorer sensing quality.

In view of the above, there is need in providing an advanced magnetic-field sensing method to overcome the problems of the prior arts.

SUMMARY OF THE INVENTION

It is one object of the present invention to provide a magnetic-field sensing method comprising steps as follows. A magnetoresistive sensing device is provided on a substrate plane, wherein the substrate plane defines an x-axis and a y-axis that are perpendicular to each other and a z-axis perpendicular to the x-axis and the y-axis. A first sensed magnetic-field component in parallel with the x-axis ($X_{sens}$) and a second sensed magnetic-field component in parallel with the y-axis ($Y_{sens}$) of an external magnetic field forming a first inclination angle ( ) with the x-axis and a second inclination angle (Ø) with the y-axis are determined. A virtual plane is defined so as to render a magnetic-field component perpendicular to the virtual plane of the external magnetic field is essentially zero. The first inclination angle ( ) and the second inclination angle (Ø) are adjusted with reference to the virtual plane. An x-axis magnetic-field component ($X_{field}$) in parallel with the x-axis, a y-axis magnetic-field component ($Y_{field}$) in parallel with the y-axis and a z-axis magnetic-field component ($Z_{field}$) in parallel with the z-axis of the external magnetic field are estimated according to the adjusted first inclination angle (+Δθ), the adjusted second inclination angle (Ø+Δθ), the first sensed magnetic-field component ($X_{sens}$) and the second sensed magnetic-field component ($Y_{sens}$).

In one embodiment of the present invention, a planar magnetoresistive sensing device is used to sense two-dimensional magnetic-field components in parallel with the substrate plane to further estimate the three-dimensional magnetic field above the substrate plane. Since the magnetic-field component perpendicular to the substrate plane can be estimated without using additional multi-chip or three-dimensional structured magnetoresistive sensing devices, the magnetic-field sensing device in one embodiment of the present invention uses less complicated configurations to reduce the manufacturing cost and overcome the problem of low process yield due to the use of down-scaled semiconductor elements. Furthermore, since the magnetic-field component perpendicular to the substrate plane can be estimated by the use of the two-dimensional sensed magnetic-field components in parallel with the substrate plane, the inaccuracy will be reduced because the values of the sensed results do not have to be normalized.

BRIEF DESCRIPTION OF THE DRAWINGS

The objects, spirits and advantages of the embodiments of the present invention will be readily understood by the accompanying drawings and detailed descriptions, in which.

DETAILED DESCRIPTION OF PREFERRED EMBODIMENTS

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

The present invention provides a magnetic-field sensing method using a planar magnetoresistive sensor to sense two-dimensional magnetic-field components in parallel with the substrate plane to further estimate the three-dimensional magnetic field above the substrate plane.

Figure 1:
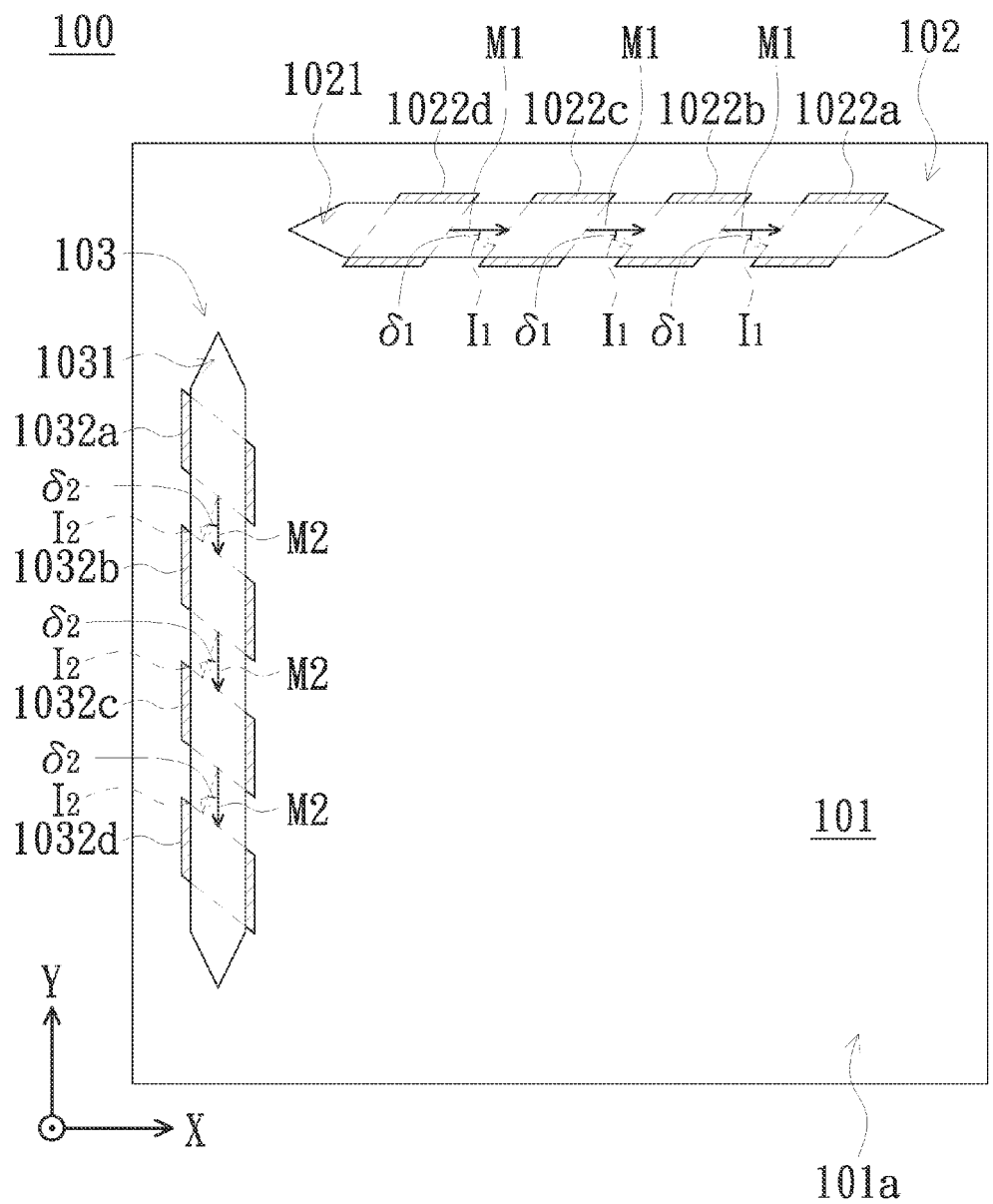
FIG. 1 is a top view of a magnetoresistive sensing device according to one embodiment of the present invention.

The magnetic-field sensing method comprises the following steps. First, a magnetoresistive sensing device is provided. Please refer to FIG. 1, which is a top view of a magnetoresistive sensing device 100 according to one embodiment of the present invention. The magnetoresistive sensing device 100 comprises at least a first magnetoresistive sensing unit 102 and a second magnetoresistive sensing unit 103 on a substrate 101.

The substrate 101 can be a silicon substrate with an insulating material coated thereon or a silicon chip with front end logic circuits. The substrate 101 has a substrate plane 101a defining an x-axis and a y-axis that are perpendicular to each other and a z-axis perpendicular to the x-axis and the y-axis.

The first magnetoresistive sensing unit 102 preferably using the conventional anisotropic magnetoresistance (AMR) structural design comprises a magnetic layer 1021 and a plurality of electrodes (such as electrodes 1022a, 1022b, 1022c and 1022d). The electrodes 1022a, 1022b, 1022c and 1022d are disposed on the substrate plane 101a of the substrate 101 and are separated from one another. The magnetic layer 1021 is disposed on the substrate plane 101a and physically contacts the electrodes 1022a, 1022b, 1022c and 1022d. The long axis of the magnetic layer 1021 is perpendicular to the y-axis of the substrate plane 101a.

In some embodiments of the present invention, the electrodes 1022a, 1022b, 1022c and 1022d are formed of identical or non-identical patterned metal layers. The magnetic layer 1021 is formed of, but not limited by, a material composed of a ferromagnetic material, an antiferromagnetic material, a non-ferromagnetic metal material, a tunneling oxide material or a combination of the above so that the electrodes 1022a, 1022b, 1022c and 1022d can be electrically connected with one another. The current flowing through the magnetic layer 102 defines a plurality of current paths I1 with the lowest resistances between two neighboring electrodes.

Furthermore, the magnetic layer 1021 is provided with a magnetization direction M1 in parallel with the magnetic layer surface due to shape anisotropy when there is no external magnetic field applied. When the electrodes 1022a, 1022b, 1022c and 1022d are electrically connected with one another, the current paths I1 in the magnetic layer 1021 form a specific angle δ1 with the magnetization direction M1. The angle δ1 is preferably 45° when the external magnetic field is zero. When the magnetoresistive sensing unit 102 is subject to an external magnetic field in parallel with magnetic layer 102, the magnetization direction M1 varies with the external magnetic field. If the current path direction is fixed, the angle δ1 changes to increase or decrease the magnetoresistance so that the variation of the magnetic field perpendicular to the y-axis can be sensed.

The second magnetoresistive sensing unit 103 also using the conventional anisotropic magnetoresistance (AMR) structural design comprises a magnetic layer 1031 and a plurality of electrodes (such as electrodes 1032a, 1032b, 1032c and 1032d). The electrodes 1032a, 1032b, 1032c and 1032d are disposed on the substrate plane 101a of the substrate 101 and are separated from one another. The magnetic layer 1031 is also disposed on the substrate plane 101a and physically contacts the electrodes 1032a, 1032b, 1032c and 1032d. The long axis of the magnetic layer 1031 is perpendicular to the x-axis of the substrate plane 101a.

In some embodiments of the present invention, the electrodes 1032a, 1032b, 1032c and 1032d are formed of identical or non-identical patterned metal layers. The magnetic layer 1031 is formed of, but not limited by, a material composed of a ferromagnetic material, an antiferromagnetic material, a non-ferromagnetic metal material, a tunneling oxide material or a combination of the above so that the electrodes 1032a, 1032b, 1032c and 1032d can be electrically connected with one another. The current flowing through the magnetic layer 103 defines a plurality of current paths I2 with the lowest resistances between two neighboring electrodes.

Furthermore, the magnetic layer 1031 is provided with a magnetization direction M2 in parallel with the magnetic layer surface due to shape anisotropy when there is no external magnetic field applied. When the electrodes 1032a, 1032b, 1032c and 1032d are electrically connected with one another, the current paths I2 of the magnetic layer 1031 form a specific angle δ2 with the magnetization direction M2. The angle δ2 is preferably 45° when the external magnetic field is zero. When the magnetoresistive sensing unit 103 is subject the external magnetic field in parallel with magnetic layer 103, the magnetization direction M2 varies with the external magnetic field. If the current path direction is fixed, the angle δ2 changes to increase or decrease the magnetoresistance so that the variation of the magnetic field perpendicular to the x-axis can be sensed.

It is noted that the magnetoresistive sensing units 102 and 103 of the previous embodiment have an anisotropical magnetoresistive sensing structure formed of a single magnetic layer. However, in some embodiments of the present invention, the magnetoresistive sensing units 102 and 103 can also have a giant magnetoresistance (GMR) structure, a tunneling magnetoresistance (TMR) structure or a colossal magnetoresistance (CMR) structure formed of stacked magnetic layers.

Figure 2:
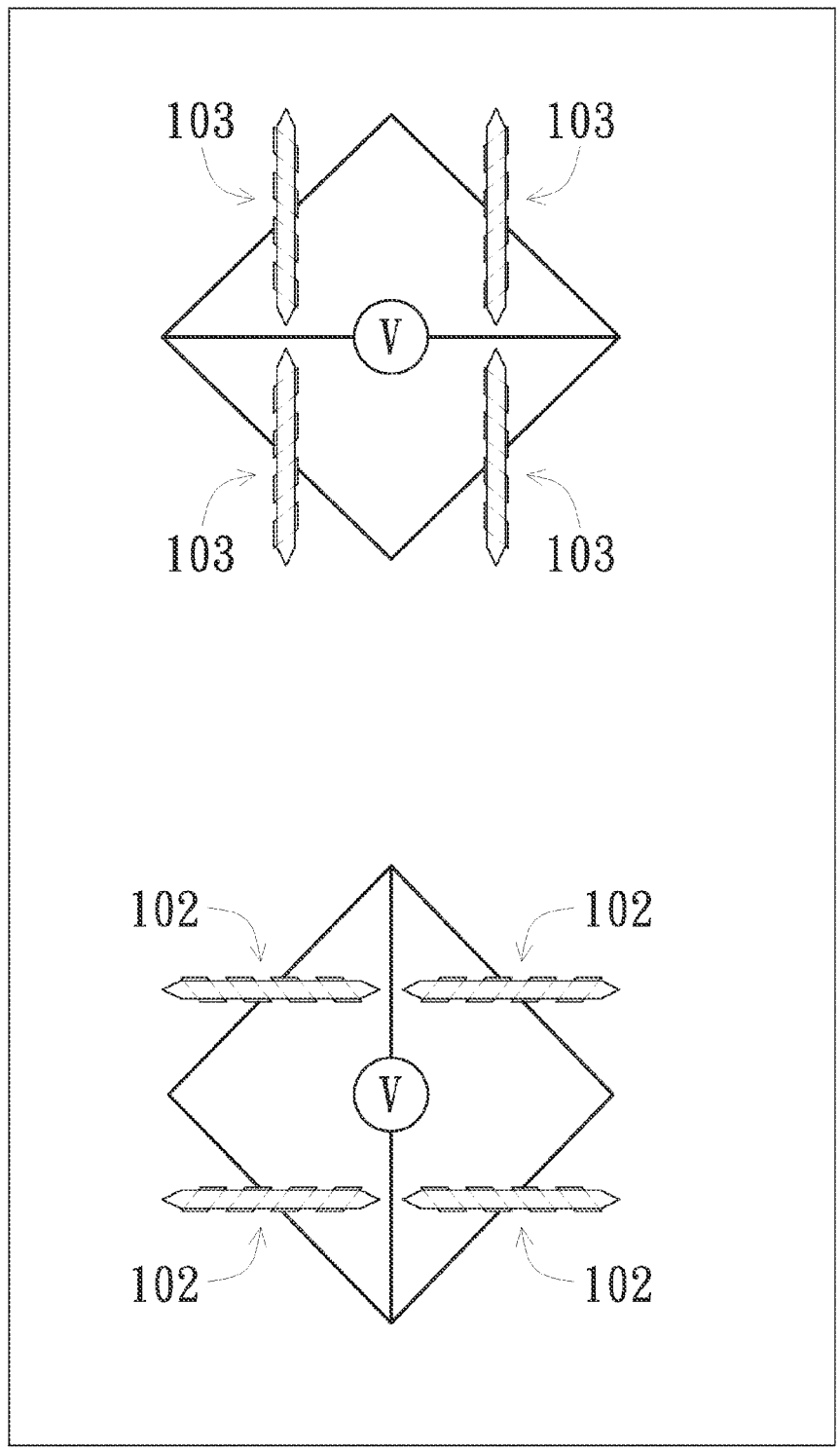
FIG. 2 is a layout of a magnetoresistive sensing device according to another embodiment of the present invention.

In order to enhance the sensibility of the magnetoresistive sensing device, a plurality of magnetoresistive sensing units can be integrated to form a magnetoresistive sensing device with improved sensibility. For example, FIG. 2 is a layout of a magnetoresistive sensing device according to one embodiment of the present invention. The magnetoresistive sensing device 200 includes four magnetoresistive sensing units 102 of FIG. 1 and four magnetoresistive sensing units 103 of FIG. 1 to construct two Wheatstone bridge circuits. By the use of the Wheatstone bridge circuits, the magnetoresistive signal can be amplified to sense the variation of the magnetic field more sensitively. Since the Wheatstone bridge circuits have been well known to those with ordinary skills in the art, detailed descriptions thereof are not presented herein.

The above-mentioned magnetoresistive sensing device 100 and other elements (not shown) can be integrated to form a magnetic-field sensing device 10. Please refer to FIG. 3, which is a schematic diagram of a magnetic-field sensing device 10 sensing an external magnetic field M3 according to a preferred embodiment of the present invention. The external magnetic field M3 forms with the x-axis and the y-axis on the substrate plane 101a a first inclination angle θ and a second inclination angle Ø, respectively, that are essentially larger than 0° and smaller than 180°. The magnetic-field sensing device 10 is capable of sensing a first sensed magnetic-field component $X_{sens}$ in parallel with the x-axis and a second sensed magnetic-field component $Y_{sens}$ in parallel with the y-axis. Furthermore, a third sensed magnetic-field component $Z_{sens}$ in parallel with the z-axis can be calculated with the use of the first sensed magnetic-field component $X_{sens}$ and the second sensed magnetic-field component $Y_{sens}$ so as to estimate an x-axis magnetic-field component) $X_{field}$ in parallel with the x-axis and a y-axis magnetic-field component $Y_{field}$ in parallel with the y-axis of the external magnetic field M3.

Figure 3:
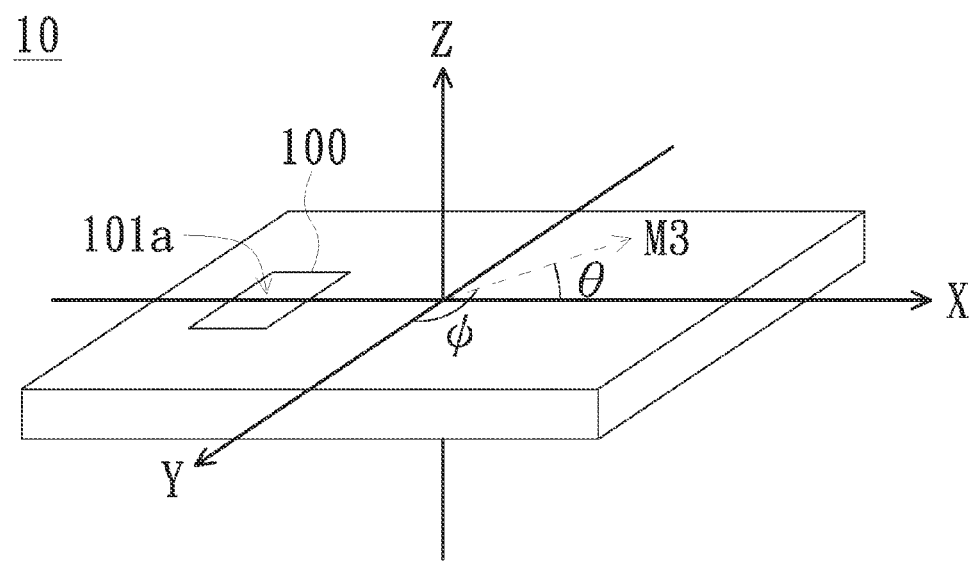
FIG. 3 is a schematic diagram of a magnetic-field sensing device sensing an external magnetic field according to a preferred embodiment of the present invention.

Taking a specific embodiment for example, ideally, assuming that the external magnetic field M3 defines a virtual plane so as to render the magnetic-field component perpendicular to the virtual plane (i.e., the z-axis magnetic-field component $Z_{field}$) is essentially zero and the virtual plane is the plane to observe the magnetic field (as shown in FIG. 3), the x-axis magnetic-field component $X_{field}$, the y-axis magnetic-field component $Y_{field}$, the z-axis magnetic-field component $Z_{field}$ and the third sensed magnetic-field component $Z_{sens}$ can be estimated by:

$$\begin{cases} Z_{field} = 0 \\ X_{field} = X_{sens}/\cos(\emptyset); \\ Y_{field} = Y_{sens}/\cos(\theta) - X_{sens}\tan(\theta)\tan(\emptyset); \\ Z_{sens} = -X_{sens}\tan(\emptyset)sec(\theta) + Y_{sens}\tan(\theta) \end{cases} \quad (3\text{-}1)$$

It is noted that the substrate plane 101a serves as an observing plane when the magnetic-field sensing device 10 is used. However, with the rotation due to usage, the substrate plane 101a is provided with a plurality of inclination states, which causes a deviation between the observing plane and the virtual plane. Therefore, when the virtual plane where the z-axis magnetic-field component of the external magnetic field M3 is zero due to the inclination state of the magnetic-field sensing device 10 is not identical to the observing plane (where $Z_{field} \neq 0$), the z-axis magnetic-field component $Z_{field}$ has to be taken into account when estimating the x-axis magnetic-field component $X_{field}$, the y-axis magnetic-field component $Y_{field}$, the z-axis magnetic-field component $Z_{field}$ and the third sensed magnetic-field component $Z_{sens}$. Accordingly, the first sensed magnetic-field component $X_{sens}$ and the second sensed magnetic-field component $Y_{sens}$ have to be adjusted.

In one embodiment of the present invention, the x-axis magnetic-field component $X_{field}$, the y-axis magnetic-field component $Y_{field}$, the z-axis magnetic-field component $Z_{field}$ and the third sensed magnetic-field component $Z_{sens}$ are adjusted and estimated to compensate the first inclination angle $\theta$ and the second inclination angle $\emptyset$ formed by the external magnetic field M3 with the x-axis and the y-axis of the substrate plane 101a, respectively, when the magnetic-field sensing device 10 is in one of the inclination states.

First, a first adjusted angle $\Delta\theta$ and a second adjusted angle $\Delta\emptyset$ deviated from the x-axis and the y-axis, respectively, are calculated according to the inclination state of the substrate plane 101a as shown in FIG. 3. Then, the first inclination angle ($\theta$) and the first adjusted angle ($\Delta\theta$) are summed up and the second inclination angle ($\emptyset$) and the second adjusted angle ($\Delta\emptyset$) are summed up. The adjusted first inclination angle ($\theta+\Delta\theta$) and adjusted second inclination angle ($\emptyset+\Delta\emptyset$) are used to replace the first inclination angle $\theta$ and the second inclination angle $\emptyset$ in Equations 3 to obtain Equations 3-1 to further calculate the x-axis magnetic-field component $X_{field}$, the y-axis magnetic-field component $Y_{field}$, the z-axis magnetic-field component $Z_{field}$ and the third sensed magnetic-field component $Z_{sens}$, expressed as:

$$\begin{cases} Z_{field} \neq 0 \\ X_{field} = X_{sens}/\cos(\emptyset + \Delta\emptyset); \\ Y_{field} = Y_{sen}/\cos(\theta + \Delta\theta) - X_{sens}\tan(\theta + \Delta\theta)\tan(\emptyset + \Delta\emptyset); \\ Z_{sens} = -X_{sens}\tan(\emptyset + \Delta\emptyset)sec(\theta + \Delta\theta) + Y_{sens}\tan(\theta + \Delta\theta) \end{cases} \quad (3\text{-}2)$$

However, for actual operation, the adjusted angles of the x-axis and the y-axis of the substrate plane 101a with respect to the virtual x-axis X' and the virtual y-axis Y' of the virtual plane cannot be estimated immediately from the x-axis magnetic-field component $X_{field}$, the y-axis magnetic-field component $Y_{field}$ and the z-axis magnetic-field component $Z_{field}$. Therefore, a learning scheme is required. First, a virtual plane 104 where the z-axis magnetic-field component of the external magnetic field M3 is essentially zero is defined by the magnetic-field sensing device 10 according to the substrate plane 101a in the present state. The first adjusted angle $\Delta\theta$ and the second adjusted angle $\Delta\emptyset$ of the x-axis and the y-axis with respect to the virtual x-axis X' and the virtual y-axis Y' are calculated respectively. Then, the x-axis magnetic-field component $X_{field}$, the y-axis magnetic-field component $Y_{field}$, the z-axis magnetic-field component $Z_{field}$ and the third sensed magnetic-field component $Z_{sens}$ are estimated.

Figure 4:
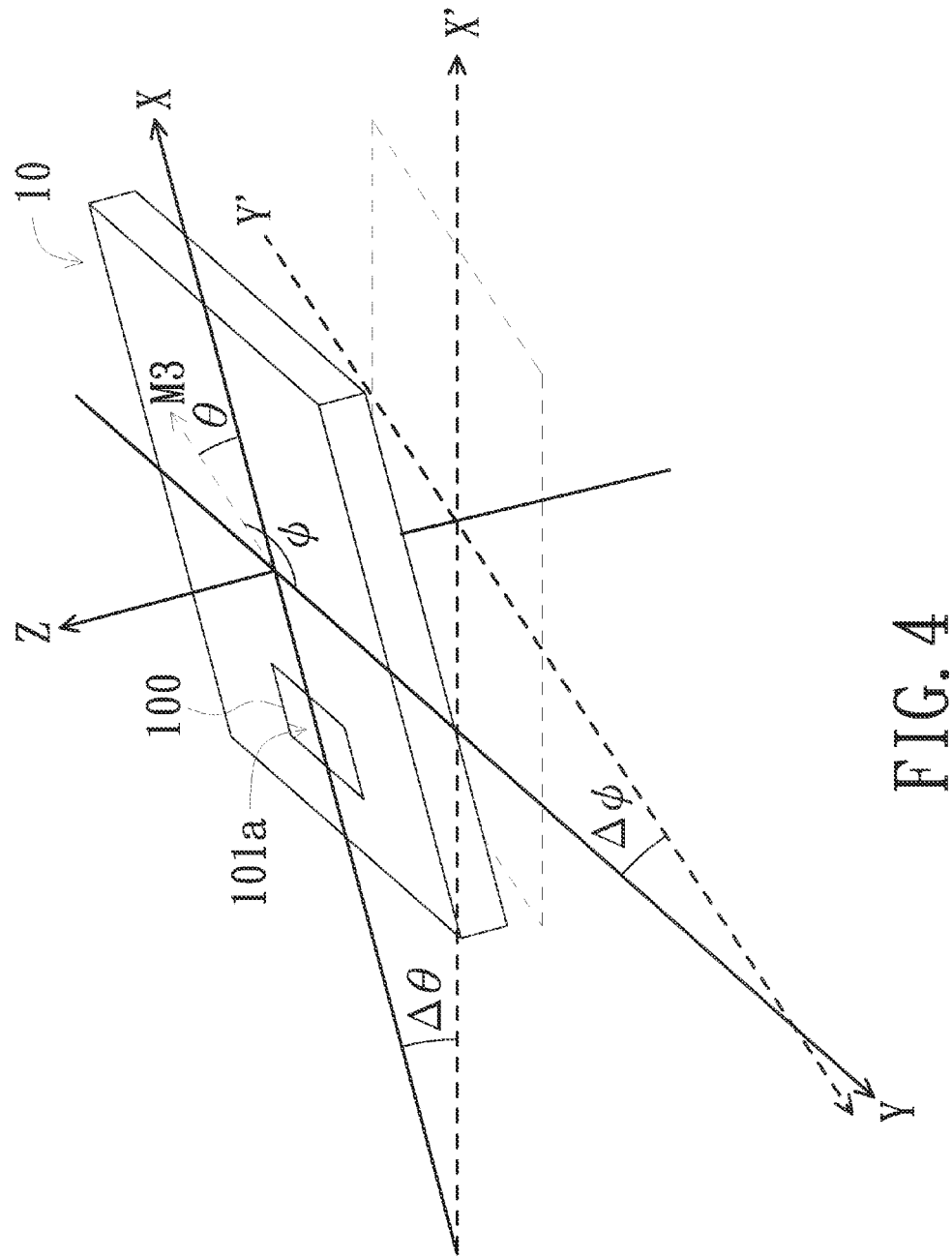
FIG. 4 is a schematic diagram defining a virtual plane according to one embodiment of the present invention.

Please refer to FIG. 4, which is a schematic diagram defining a virtual plane according to a preferred embodiment of the present invention. The virtual plane 104 is defined by the virtual x-axis X' and the virtual y-axis Y' perpendicular to each other.

In some embodiments of the present invention, the learning scheme for defining the virtual plane 104 comprises steps as set forth below. First, the magnetic-field sensing device 10 is rotated so that a plurality of inclination states are provided with respect to the substrate plane 101a and that a first adjusted angle $\Delta\theta$ and a second adjusted angle $\Delta\emptyset$ are deviated from the x-axis and the y-axis in each inclination state. Then, the first sensed magnetic-field component $X_{sens}$ in parallel with the x-axis and the second sensed magnetic-field component $Y_{sens}$ in parallel with the y-axis under different inclination states are sensed and put into Equation 3-1 to calculate the third sensed magnetic-field component $Z_{sens}$ in parallel with the z-axis. The inclined substrate plane 101a with the third sensed magnetic-field component $Z_{sens}$ of essentially zero is the virtual plane 104.

Afterwards, the first inclination angle $\theta$ and the second inclination angle $\emptyset$ are adjusted for the inclined virtual plane 104 according to the first adjusted angle $\Delta\theta$ and the second adjusted angle $\Delta\emptyset$ deviated from the x-axis and the y-axis on the present observing plane. The adjusted first inclination angle ($\theta+\Delta\theta$) and the adjusted second inclination angle ($\emptyset+\Delta\emptyset$) are then put into Equation 3-2. The third sensed magnetic-field component $Z_{sens}$ in parallel with the z-axis can be calculated from the first sensed magnetic-field component $X_{sens}$ in parallel with the x-axis and the second sensed magnetic-field component $Y_{sens}$ in parallel with the y-axis to estimate the x-axis magnetic-field component $X_{field}$ in parallel with the x-axis and the y-axis magnetic-field component $Y_{field}$ in parallel with the y-axis of the external magnetic field M3. The third sensed magnetic-field component $Z_{sens}$ in parallel with the z-axis can be regarded as an estimated z-axis magnetic-field component $Z_{field}$.

Since the third sensed magnetic-field component $Z_{sens}$ is derived from the first sensed magnetic-field component $X_{sens}$ and the second sensed magnetic-field component $Y_{sens}$ sensed at the same time by the magnetoresistive sensing device 100, no additional normalization process is required on the above three values so that the inaccuracy can be reduced.

Figure 5:
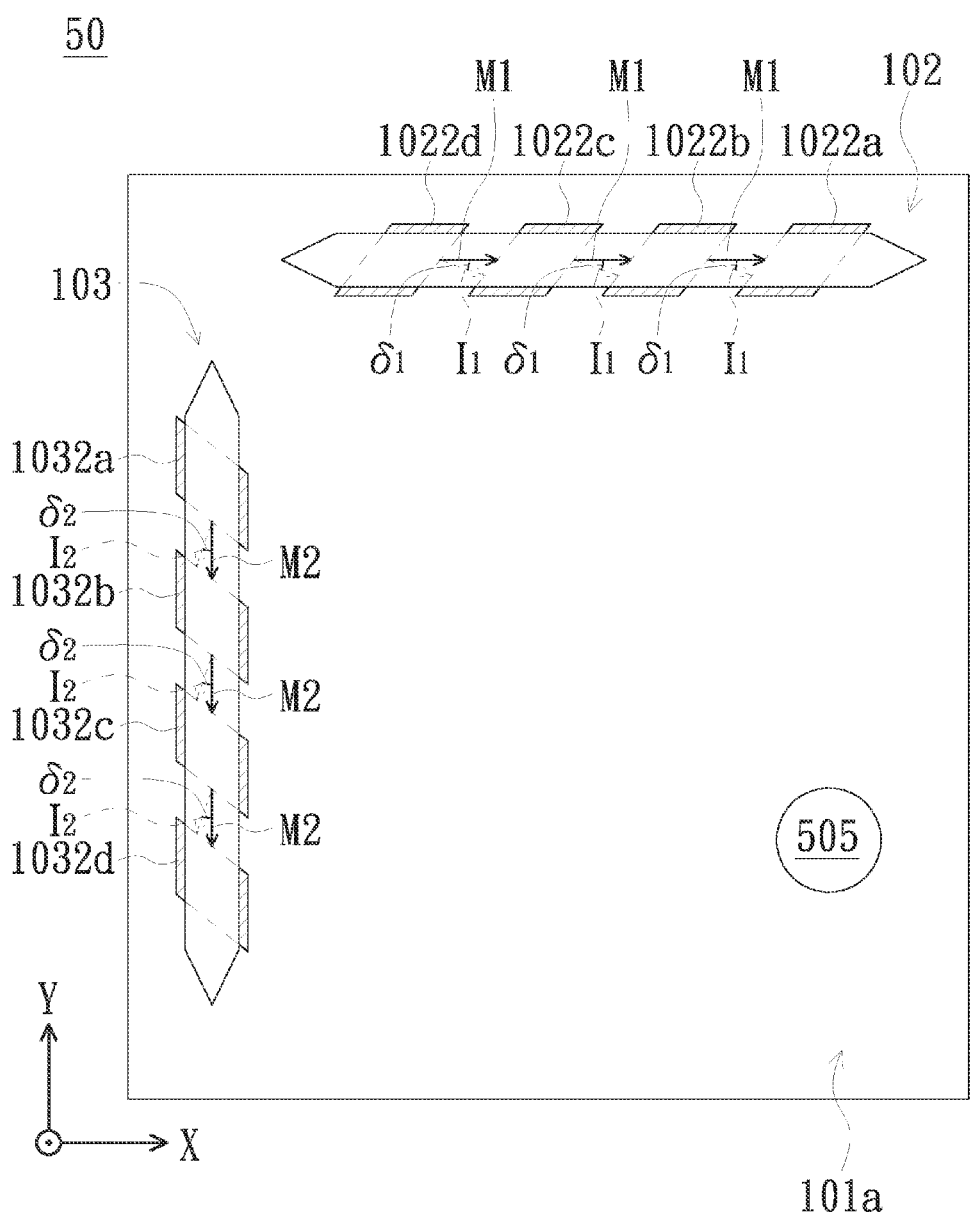
FIG. 5 is a top view of a magnetoresistive sensing device according to another embodiment of the present invention.

FIG. 5 is a top view of a magnetoresistive sensing device 50 according to another embodiment of the present invention. In the present embodiment, when the external magnetic field M3 is a terrestrial magnetic field, a gravity sensor 505 can be used to obtain the first inclination angle $\theta$ and the second inclination angle $\emptyset$ on the observing plane to further estimate the x-axis magnetic-field component $X_{field}$ in parallel with the x-axis and the y-axis magnetic-field component $Y_{field}$ in parallel with the y-axis of the terrestrial magnetic field. The third sensed magnetic-field component $Z_{sens}$ in parallel with the z-axis can be regarded as an estimated z-axis magnetic-field component $Z_{field}$ of the terrestrial magnetic field.

Accordingly, in the present invention, the magnetic-field sensing device 50 can be used for an electronic compass. More particularly, the magnetic-field sensing device 50 includes essentially the above-mentioned magnetoresistive sensing device 100 and a gravity sensor 505. In some preferred embodiments of the present invention, the magnetoresistive sensing device 100 and the gravity sensor 505 are micro-electro-mechanical systems (MEMS) manufactured by semiconductor processing.

In one embodiment of the present invention, a planar magnetoresistive sensing device is used to sense two-dimensional magnetic-field components in parallel with the substrate plane to further estimate the three-dimensional magnetic field above the substrate plane. Since the magnetic-field component perpendicular to the substrate plane can be estimated without using additional multi-chip or three-dimensional structured magnetoresistive sensing devices, the magnetic-field sensing device in one embodiment of the present invention uses less complicated configurations to reduce the manufacturing cost and overcome the problem of low process yield due to the use of down-scaled semiconductor elements. Furthermore, since the magnetic-field component perpendicular to the substrate plane can be estimated by the use of the two-dimensional sensed magnetic-field components in parallel with the substrate plane, the inaccuracy will be reduced because the values of the sensed results do not have to be normalized.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A magnetic-field sensing method, comprising steps of:
   providing a magnetoresistive sensing device on a substrate plane, wherein the substrate plane defines an x-axis and a y-axis that are perpendicular to each other and a z-axis perpendicular to the x-axis and the y-axis;
   determining a first sensed magnetic-field component in parallel with the x-axis ($X_{sens}$) and a second sensed magnetic-field component in parallel with the y-axis ($Y_{sens}$) of an external magnetic field forming a first inclination angle ( ) with the x-axis and a second inclination angle (Ø) with the y-axis;
   defining a virtual plane so as to render a magnetic-field component of the external magnetic field perpendicular to the virtual plane is essentially zero;
   adjusting the first inclination angle ( ) and the second inclination angle (Ø) with reference to the virtual plane; and
   estimating an x-axis magnetic-field component ($X_{field}$) in parallel with the x-axis, a y-axis magnetic-field component ($Y_{field}$) in parallel with the y-axis and a z-axis magnetic-field component ($Z_{field}$) in parallel with the z-axis of the external magnetic field according to the adjusted first inclination angle (+Δ), the adjusted second inclination angle (Ø+ΔØ), the first sensed magnetic-field component ($X_{sens}$) and the second sensed magnetic-field component ($Y_{sens}$).

2. The magnetic-field sensing method according to claim 1, wherein the step of defining a virtual plane comprises steps of:
   providing a plurality of inclination states of the substrate plane so that the external magnetic field forms a plurality of the first inclination angles ( ) with the x-axis and a plurality of the second inclination angles (Ø) with the y-axis according to the inclination states;
   sensing the first sensed magnetic-field component ($X_{sens}$) and the second sensed magnetic-field component ($Y_{sens}$) under the inclination states and determining a third sensed magnetic-field component in parallel with the z-axis ($Z_{sens}$) according to the first sensed magnetic-field component ($X_{sens}$) and the second sensed magnetic-field component ($Y_{sens}$) under the inclination states; and
   determining the substrate plane with the third sensed magnetic-field component ($Z_{sens}$) of essentially zero under one of the inclination states as the virtual plane.

3. The magnetic-field sensing method according to claim 2, wherein the third sensed magnetic-field component ($Z_{sens}$) is estimated by:

$$Z_{sens} = -X_{sens}\tan(Ø)\sec(\ ) + Y_{sens}\tan(\ ).$$

4. The magnetic-field sensing method according to claim 1, wherein the virtual plane is defined by a virtual x-axis and a virtual y-axis perpendicular to each other so that a first adjusted angle (Δ) is formed between the x-axis and the virtual x-axis and a second adjusted angle (ΔØ) is formed between the y-axis and the virtual y-axis.

5. The magnetic-field sensing method according to claim 4, wherein the step of adjusting the first inclination angle ( ) and the second inclination angle (Ø) comprises steps of:
   summing up the first inclination angle ( ) and the first adjusted angle (Δ); and
   summing up the second inclination angle (Ø) and the second adjusted angle (ΔØ).

6. The magnetic-field sensing method according to claim 5, wherein the x-axis magnetic-field component ($X_{field}$) the y-axis magnetic-field component ($Y_{field}$) and the z-axis magnetic-field component ($Z_{field}$) of the external magnetic field are estimated by:

$$X_{field} = X_{sens}/\cos(Ø+ΔØ);$$

$$Y_{field} = Y_{sen}/\cos(+Δ) - X_{sens}\tan(+Δ)\tan(Ø+ΔØ); \text{ and}$$

$$Z_{field} = -X_{sens}\tan(Ø+ΔØ)\sec(+Δ) + Y_{sens}\tan(+Δ).$$

7. The magnetic-field sensing method according to claim 1, wherein the magnetoresistive sensing device comprises:
   at least one first magnetoresistive sensing unit, comprising:
      a first electrode, disposed on the substrate plane;
      a second electrode, disposed on the substrate plane; and
      a first magnetic layer, disposed on the substrate plane, having a first magnetization direction in parallel with the x-axis and a first current path for conducting the first electrode and the second electrode, wherein a first angle is formed between the first current path and the first magnetization direction; and
   at least one second magnetoresistive sensing unit, comprising:
      a third electrode, disposed on the substrate plane;
      a fourth electrode, disposed on the substrate plane; and
      a second magnetic layer, disposed on the substrate plane, having a second magnetization direction in parallel with the y-axis, and a second current path for conducting the third electrode and the fourth electrode, wherein a second angle is formed between the second current path and the second magnetization direction.

8. The magnetic-field sensing method according to claim 7, wherein the magnetoresistive sensing device comprises:
   four first magnetoresistive sensing units, connected to one another to construct a Wheatstone bridge circuit; and
   four second magnetoresistive sensing units, connected to one another to construct a Wheatstone bridge circuit.

9. The magnetic-field sensing method according to claim 1, wherein the first inclination angle ( ) and the second inclination angle (Ø) can be adjusted by a gravity sensor when the external magnetic field is a terrestrial magnetic field.

10. An electronic compass, comprising a magnetoresistive sensing device provided on a substrate plane and a gravity sensor, wherein:
- the substrate plane defines an x-axis and a y-axis that are perpendicular to each other and a z-axis perpendicular to the x-axis and the y-axis, and a first sensed magnetic-field component in parallel with the x-axis ($X_{sens}$);
- a second sensed magnetic-field component in parallel with the y-axis ($Y_{sens}$) of an external magnetic field forming a first inclination angle ( ) with the x-axis and a second inclination angle (Ø) with the y-axis can be determined; and
- the first inclination angle ( ) and the second inclination angle (Ø) can be adjusted by a gravity sensor when the external magnetic field is a terrestrial magnetic field;
- the magnetoresistive sensing device comprises:
  - at least one first magnetoresistive sensing unit, comprising:
    - a first electrode, disposed on the substrate plane;
    - a second electrode, disposed on the substrate plane; and
    - a first magnetic layer, disposed on the substrate plane, having a first magnetization direction in parallel with the x-axis and a first current path for conducting the first electrode and the second electrode, wherein a first angle is formed between the first current path and the first magnetization direction; and
  - at least one second magnetoresistive sensing unit, comprising:
    - a third electrode, disposed on the substrate plane;
    - a fourth electrode, disposed on the substrate plane; and
    - a second magnetic layer, disposed on the substrate plane, having a second magnetization direction in parallel with the y-axis, and a second current path for conducting the third electrode and the fourth electrode, wherein a second angle is formed between the second current path and the second magnetization direction.

* * * * *